United States Patent [19]
Yang

[11] Patent Number: 5,650,657
[45] Date of Patent: Jul. 22, 1997

[54] PROTECTION FROM SHORT CIRCUITS BETWEEN P AND N WELLS

[75] Inventor: Ming-Tzong Yang, Hsin Chu, Taiwan

[73] Assignee: United Microelectronics Corporation, Hsin-Chu, Taiwan

[21] Appl. No.: 347,680

[22] Filed: Dec. 1, 1994

Related U.S. Application Data

[62] Division of Ser. No. 100,306, Aug. 2, 1993, Pat. No. 5,372,955.

[51] Int. Cl.⁶ .............................. H01L 29/76; H01L 29/94
[52] U.S. Cl. ...................... 257/409; 257/357; 257/369; 257/355; 257/546
[58] Field of Search .................... 257/127, 170, 257/409, 452, 484, 605, 355.7, 369, 370, 546

[56] References Cited

U.S. PATENT DOCUMENTS

| | | | |
|---|---|---|---|
| 3,665,266 | 5/1972 | Drozdowicz et al. | 257/409 |
| 4,277,291 | 7/1981 | Cerofolini et al. | 148/1.5 |
| 4,313,768 | 2/1982 | Sanders et al. | 257/127 |
| 4,414,560 | 11/1983 | Lidow | 257/409 |
| 4,476,621 | 10/1984 | Bopp et al. | 29/571 |
| 4,574,467 | 3/1986 | Halfacre et al. | 257/127 |
| 4,912,054 | 3/1990 | Tomassetti | 437/31 |
| 5,181,091 | 1/1993 | Harrington, III et al. | 257/355 |
| 5,262,345 | 11/1993 | Nasser et al. | 437/59 |
| 5,293,051 | 3/1994 | Mariyama et al. | 257/129 |
| 5,432,371 | 7/1995 | Denner et al. | 257/409 |

OTHER PUBLICATIONS

VLSI Technology, McGraw Hill Book Co. NY, NY. by SMSZE, pp. 486–491.

*Primary Examiner*—Mahshid D. Saadat
*Assistant Examiner*—T. M. Arroyo
*Attorney, Agent, or Firm*—William H. Wright; Alan S. Raynes

[57] ABSTRACT

A method of manufacture of a MOSFET device with a predetermined light positive or negative doping comprises forming a first mask upon said substrate. Dopant of a predetermined positive or negative variety is implanted through the mask. A second mask is formed over the openings in the first mask. The first mask is removed. Dopant of the opposite positive or negative variety is implanted into the openings in the second mask. The process forms a pattern of positive and negative wells in the substrate, and forms a guard ring of an opposite doping variety from the wells being protected formed in the substrate.

7 Claims, 4 Drawing Sheets

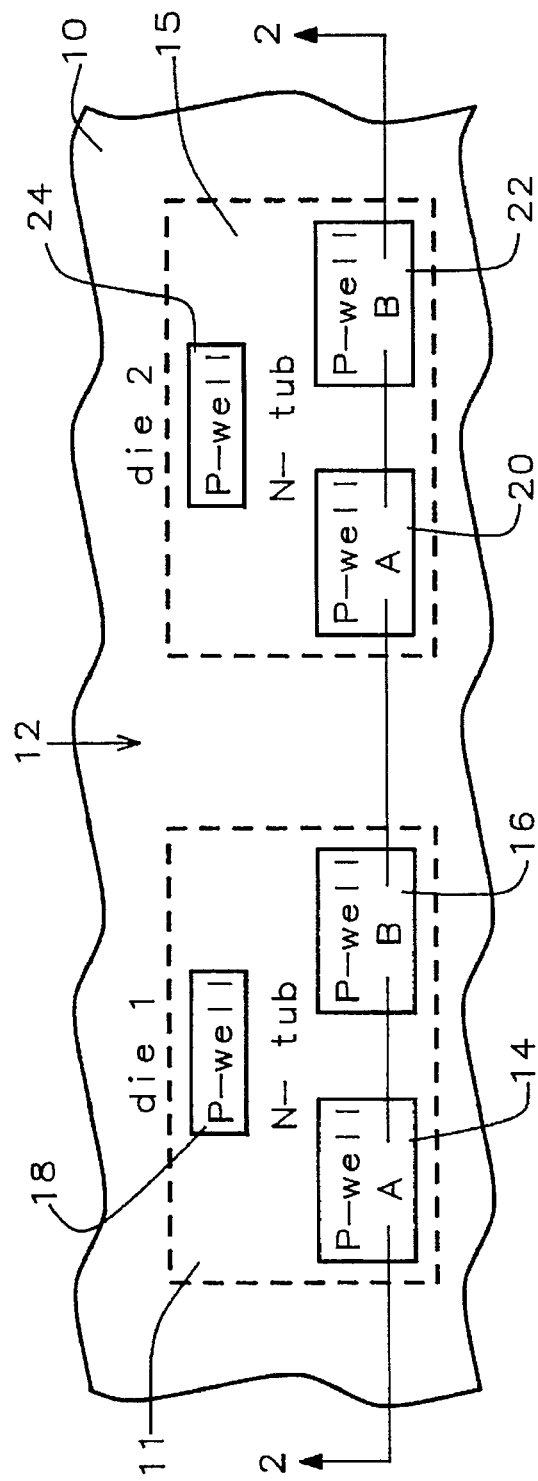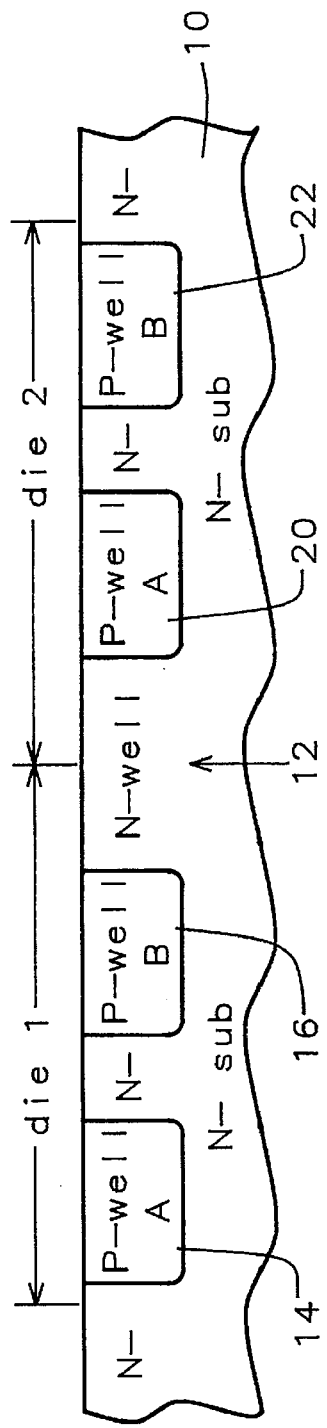
FIG. 1
FIG. 2

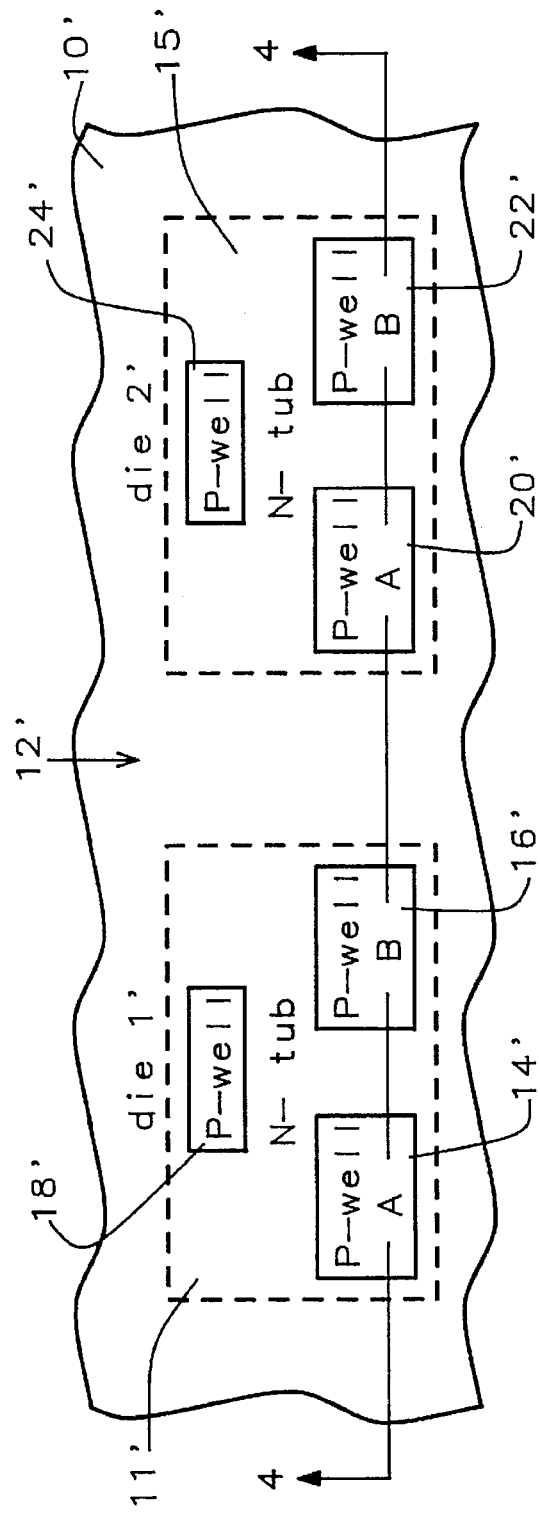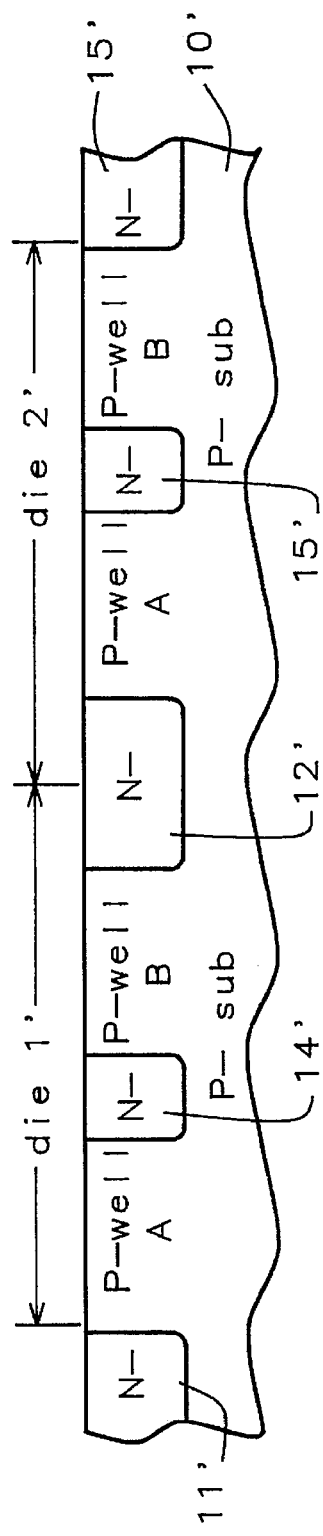
FIG. 3
FIG. 4

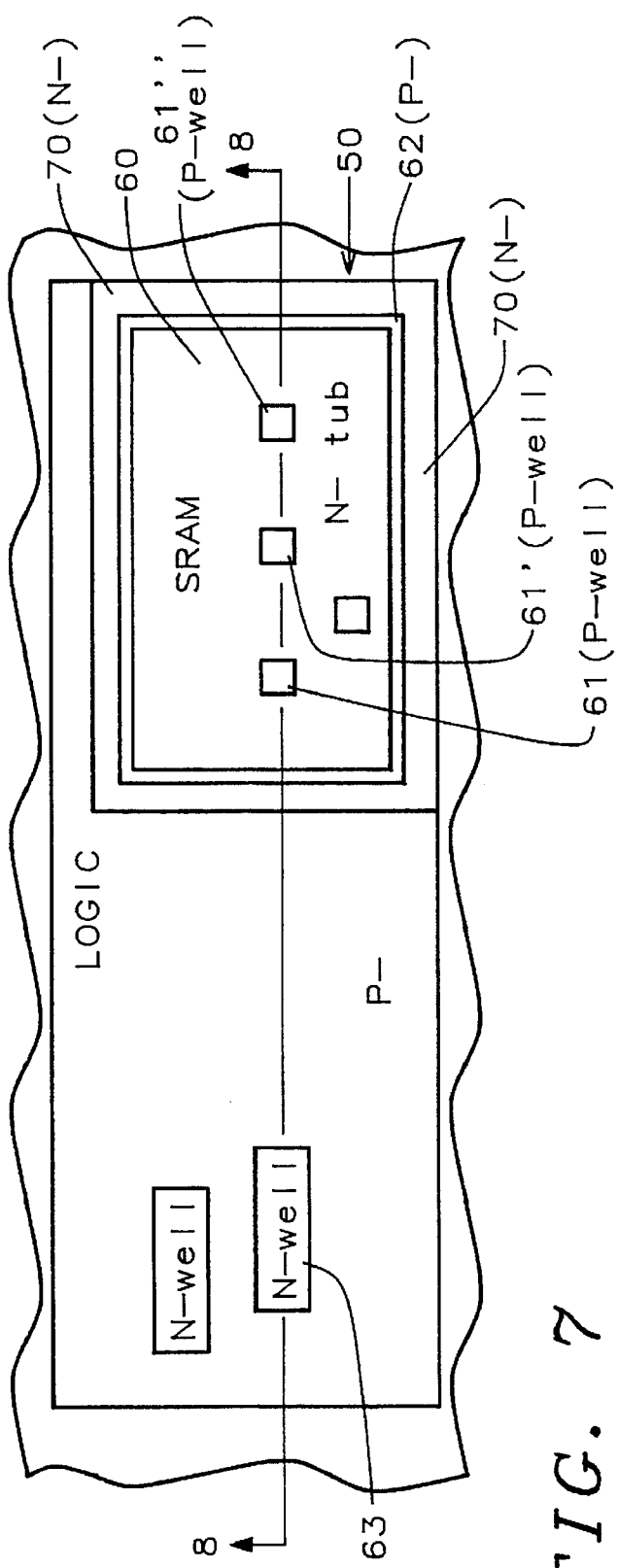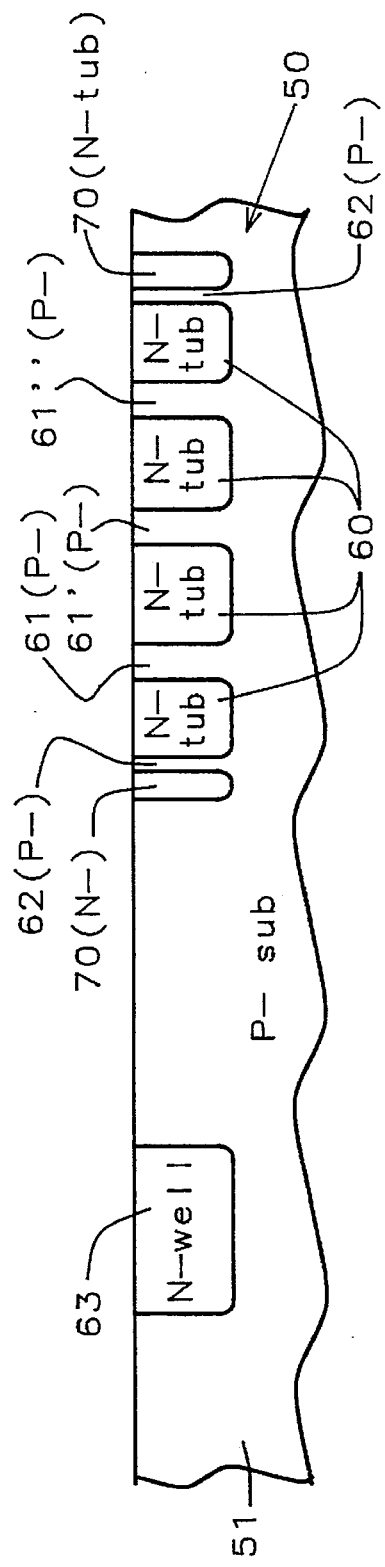
FIG. 7
FIG. 8

PROTECTION FROM SHORT CIRCUITS BETWEEN P AND N WELLS

This Application is a division of U.S. patent application Ser. No. 08/100,306, filed Aug. 2, 1993, now U.S. Pat. No. 5,372,955.

BACKGROUND OF THE INVENTION

1. Field of the Invention

This invention relates to MOSFET devices and more particularly to well structures therein.

2. Description of Related Art

A process for forming P and N well and tub structures in VLSI devices is described in Sze, VLSI Technology, McGraw Hill Book Company, pages 486–491 (1988).

An object of this invention is to provide protection from shorts when there is a change in a process of manufacture or when two different wells of the N variety and the P variety products are combined in the same die.

SUMMARY OF THE INVENTION

In accordance with this invention a method and a structure formed by a method in accordance with this invention are provided. A MOSFET device is manufactured with a predetermined light positive or negative doping including forming a first mask upon the substrate, implanting dopant material of a predetermined positive or negative variety through the mask, forming a second mask over the openings in the first mask, removing the first mask, implanting dopant material of the opposite variety into the openings in the second mask, the process forming a pattern of positive and negative wells in the substrate, and forming a guard ring of an opposite doping from the wells being protected formed in the substrate, whereby the guard ring protects against short circuits when two wells of opposite varieties are juxtaposed in a single substrate.

In accordance with this invention, is provided for manufacturing a MOSFET device with a predetermined light positive or negative doping comprising the following steps: forming a first mask upon the substrate, implanting dopant material of a predetermined positive or negative variety through the mask, forming a second mask over the openings in the first mask, removing the first mask, implanting dopant material of the opposite variety into the openings in the second mask, the process forming a pattern of positive and negative wells in the substrate, and forming a guard ring of an opposite doping from the wells being protected formed in the substrate, whereby the guard ring protects against short circuits when two wells of opposite varieties are juxtaposed in a single substrate.

Preferably, the guard ring is formed by ion implantation of a dopant material into the substrate.

Preferably, the chemical species of the dopant material implanted is boron or the chemical species of the dopant material implanted is phosphorous and the implantation is performed with a dose of between about 1E12 $cm^{-2}$ and about 1E14 $cm^{-2}$, an energy of between about 40 keV and about 500 keV.

In another aspect of the invention, a method of manufacture of a MOSFET device with a predetermined light negative doping comprises forming a first mask upon the substrate, implanting dopant material of a positive variety through the mask, forming a second mask over the openings in the first mask, removing the first mask, implanting dopant material of the negative variety into the openings in the second mask the process forming a pattern of positive and negative wells and tubs in the substrate, and forming a guard ring of a positive variety doping protecting the wells within the tubs. Preferably, the guard ring is formed by ion implantation of a dopant material into the substrate; the chemical species of the dopant material implanted is boron or the chemical species of the dopant material implanted is phosphorous, and the implantation is performed with a dose of between about 1E12 $cm^{-2}$ and about 1E14 $cm^{-2}$, at an energy of between about 40 keV and about 500 keV.

In another aspect of this invention a method of manufacture of a MOSFET device with a predetermined light negative doping comprises forming a first mask upon the substrate, implanting dopant material of a negative variety through the mask, forming a second mask over the openings in the first mask, removing the first mask, implanting dopant material of the positive variety into the openings in the second mask, the process forming a pattern of positive and negative wells and tubs in the substrate, and forming a guard ring of a negative variety doping protecting the wells within the tubs. Preferably, the guard ring is formed by ion implantation of a dopant material into the substrate; the chemical species of the dopant material implanted is boron, or the chemical species of the dopant material implanted is phosphorous; and the implantation is performed with a dose of between about 1E12 $cm^{-2}$ and about 1E14 $cm^{-2}$, an energy of between about 40 keV and about 500 keV.

BRIEF DESCRIPTION OF THE DRAWINGS

The foregoing and other aspects and advantages of this invention are explained and described below with reference to the accompanying drawings, in which:

FIG. 1 shows, in a MOSFET fabrication process, an arrangement of two adjacent dies having N- tubs on a P- substrate separated by an N- well.

FIG. 2 shows a section taken along line 2—2 in FIG. 1.

FIG. 3 is a plan view of a variation in the process of FIG. 1 but is not.

FIG. 4 is a sectional view taken along line 4—4 in FIG. 3 which shows the obvious differences from FIG. 2.

FIGS. 7 and 8 show a process for forming a guard ring to combine several different substrate dies into a chip.

DESCRIPTION OF THE PREFERRED EMBODIMENT

Figure 5:
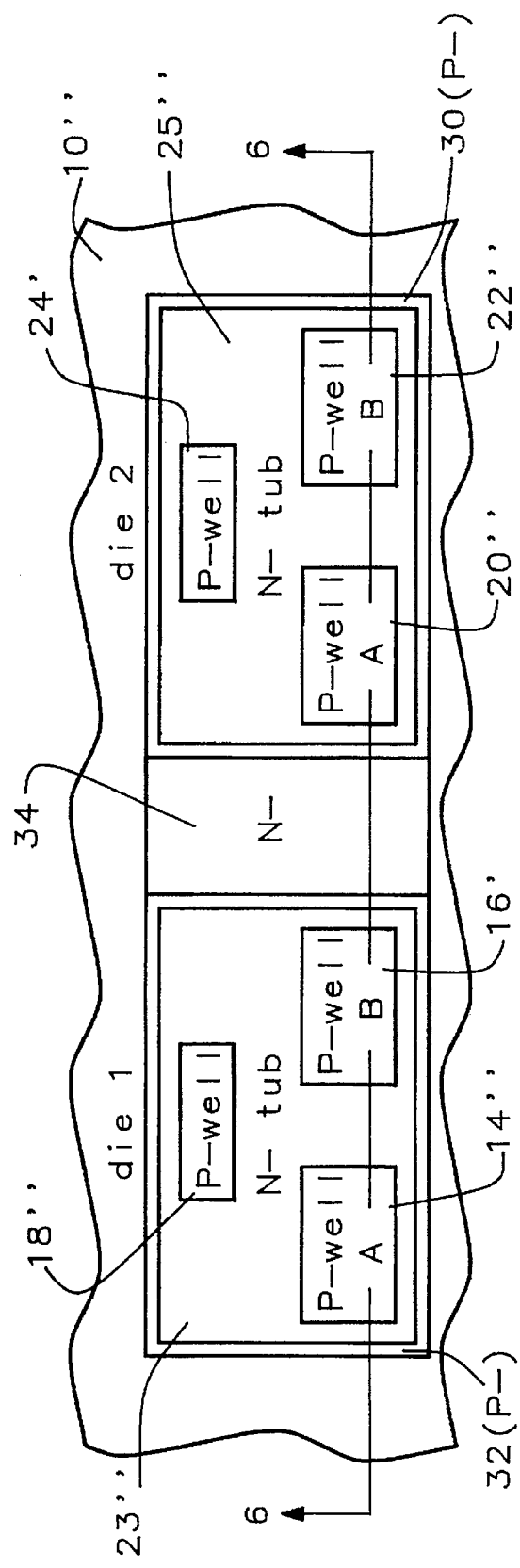
FIGS. 5 and 6 illustrate the results of a process for forming guard rings.

FIG. 1 shows, in a MOSFET fabrication process, an arrangement of two adjacent dies having N- tubs 11 and 15 on a substrate 10 separated by an N- well 12. In this case substrate 10 is doped N-. A group of P- wells 14, 16, 18 in tub 11 in die 1 and 20, 22, and 24 in N- tub 15 of die 2 are formed in the substrate 10.

FIG. 2 shows a section taken along line 2—2 in FIG. 1. As viewed in FIG. 1, the P- wells 14, 16, 18, 20, 22, and 24 are all isolated and the N- tubs 11, 12 and 15 of N- substrate 10 are common. The same is true in the case of FIG. 2. If a P- well in die 1 is shorted to the N- substrate, then die 1 fails but die 2 is not shorted because each P- well is isolated within its tub 11 or 15.

FIG. 3 is a plan view which appears to be identical to the view shown in FIG. 1, but as can be seen in FIG. 4, the sectional view is different from the sectional view in FIG. 2. If we change the substrate from an N- sub to P- sub the layouts (plan views) of FIGS. 1 and 3 are the same, but the cross sections of FIGS. 2 and 4 are different.

FIGS. 3 and 4 are analogous to FIGS. 1 and 2 with the exception that the substrate 10' is doped P- instead of N- and N- tubs 11' and 15' are formed within the surface of the P- substrate 10. Tub 11' surrounds the P- wells 14', 16', 18' in die 1 and tub 15' surrounds the P- wells 20', 22', and 24' in die 2. As viewed in FIG. 3, which is the top view, the P- wells 14', 16', 18', 20', 22', and 24' are all isolated and the N- tubs 11' and 15' and 12' are shown to be common.

The opposite appears to be true in the case of FIG. 4 with the P- wells 14', 16', 20' and 22' and the P- doped section of the substrate 10' both of which are P- and which are shown to be common. The N- wells 11', 15', and 12', are shown in FIG. 4 to be isolated.

Therefore, both the P- wells and the N- tubs are common depending upon the point of view, (plan or section). In fact the result of this configuration is that if a given P- well is shorted to an N- well, then any P- well is shorted to any N- well.

Figure 6:
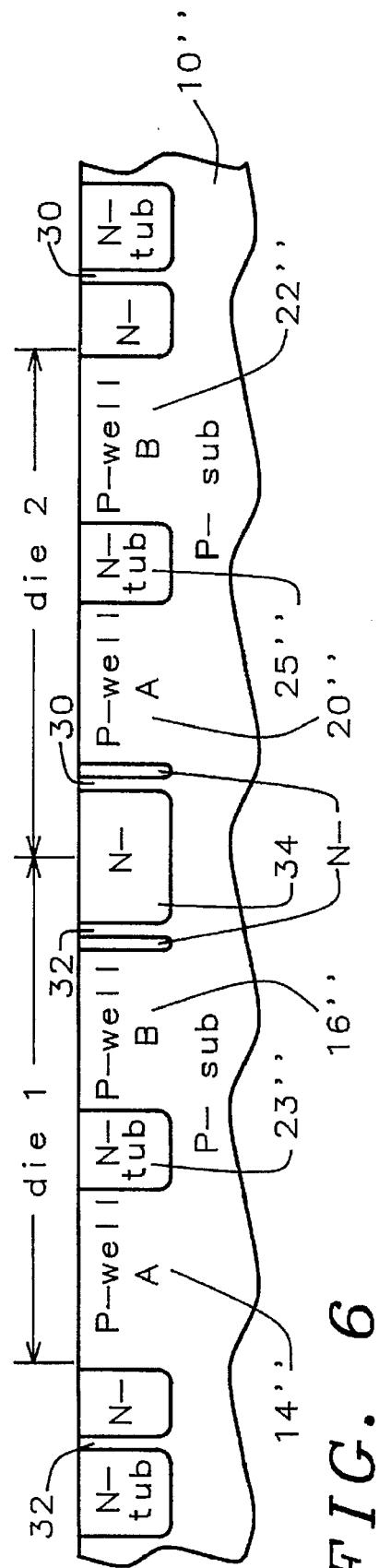

In accordance with this invention in FIGS. 5 and 6 one of a pair of P- well rings 30, 32 is shown to be added about the N- tubs 23" and 25" formed in P- sub 10" containing dies 1 and 2 in the configuration of FIGS. 3 and 4. As a result, the P- wells in each tub 23" and 25" are isolated by P- rings 30 and 32 (and the dies are separated by N- well 34) and the N- tubs are isolated, so the problem of shorting described in connection with FIGS. 3 and 4 has been overcome.

A process for forming guard rings 30 and 32 can be understood with reference to FIGS. 5 and 6. The guard rings 30 and 32 can be defined in the same layer (mask) as well. P- doped regions 14", 16", 20", and 22" for P- wells in substrate 10" with N- tubs 23", 25" are formed by ion implantation through a mask. Analogously to FIGS. 3 and 4, P- wells 18" and 24" are shown, as well. The chemical species of the P- dopant material implanted is boron with a dose of between about 1E12 $cm^{-2}$ and about 1E14 $cm^{-2}$, an energy of between about 40 keV and about 500 keV in a medium current implanter. At the end of the ion implantation, the mask is removed by the process of resist stripping either with a plasma of oxygen ($O_2$) and/or $H_2SO_4$ and $H_2O_2$. The N- dopant material employed for ion implantation is phosphorous (P) with a dose of 1E12 $cm^{-2}$ and about 1E14 $cm^{-2}$, an energy of between about 40 keV and about 500 keV.

FIGS. 7 and 8 show how this invention can be applied to the manufacture of combined logic and SRAM regions on a single substrate. The SRAM 60 is formed in an N- tub 70 in a P- substrate 50. P- wells 61 are formed in the N- tub 70. A P- guard ring 62 is formed inside the margin of the N- tub 70. The tub 70 extends beyond the P- guard ring 62 at the margin.

This arrangement provides the advantage in manufacture that the arrangement of FIGS. 3, 4 shows that there is a failure when the well is switched from an N- substrate to a P- substrate. By using the designs of FIGS. 5-8, when one must change a given tub from one dopant material to the opposite, then the guard ring will prevent the failure which would otherwise be likely to occur. It should be understood that if the original substrate doping is opposite, then the doping ring should also be the opposite.

If a P- well in die is shorted to the N- substrate, then die 1 fails but die 2 is not shorted because each P- well is isolated.

FIGS. 7 and 8 show a process for forming a guard ring 62 to combine several different substrate dies into a chip. The P- doped regions 61, 61' and 61" in an N- tub 60 on semiconductor substrate 50 (with a P- sub region 51 in which the tub 60 is formed) comprise P- tubs and the region is framed by a guard ring 62 of P- material. A nearby N- well 63 is shown outside the guard ring 62 and outside the N- tub 60 in region 70 of tub 60. The processing conditions are the same as those employed above.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent as follows:

1. A semiconductor device comprising a plurality of MOSFETs isolated in different well regions, the semiconductor device comprising:

a substrate doped to a first conductivity type;

a first tub region formed within the substrate, the first tub region doped to a second conductivity type;

at least two first well regions formed within the first tub region, the at least two first well regions doped to the first conductivity type;

a first guard ring extending around the first tub region with a region of the substrate doped to the first conductivity type disposed between the first guard ring and the first tub region, the first guard ring doped to the second conductivity type; and MOSFET devices formed on the at least two first well regions.

2. The semiconductor device of claim 1, wherein a lower edge of the first guard ring is at a first depth within the substrate and wherein a lower edge of the first tub region is similarly at the first depth within the substrate.

3. The semiconductor device of claim 1, wherein at least three first well regions are formed in the first tub region.

4. The semiconductor device of claim 1, further comprising:

a second tub region formed within the substrate, the second tub region doped to a second conductivity type;

at least two second well regions formed within the second tub region, the at least two second well regions doped to the first conductivity type;

a second guard ring extending around the second tub region with a region of the substrate doped to the first conductivity type disposed between the second guard ring and the second tub region, the second guard ring doped to the second conductivity type; and MOSFET devices formed on the at least two second well regions.

5. The semiconductor device of claim 1, wherein the first conductivity type is P-type.

6. The semiconductor device of claim 5, wherein an SRAM device is formed in the first tub region.

7. A semiconductor device comprising a plurality of MOSFETs isolated in different well regions, the semiconductor device comprising:

a substrate doped to a first conductivity type;

a first tub region formed within the substrate, the first tub region doped to a second conductivity type;

at least two first well regions formed within the first tub region, the at least two first well regions doped to the first conductivity type;

a first guard ring extending around the first tub region with a region of the substrate doped to the first conductivity type disposed between the first guard ring and the first tub region, the first guard ring doped to the second conductivity type;

MOSFET devices formed on the at least two first well regions;

a second tub region formed within the substrate, the second tub region doped to a second conductivity type;

at least two second well regions formed within the second tub region, the at least two second well regions doped to the first conductivity type;

a second guard ring extending around the second tub region with a region of the substrate doped to the first conductivity type disposed between the second guard ring and the second tub region, the second guard ring doped to the second conductivity type, wherein the first and second guard rings are separated by a region of the substrate doped to the second conductivity type; and MOSFET devices formed on the at least two second well regions.

* * * * *